Figure 1:
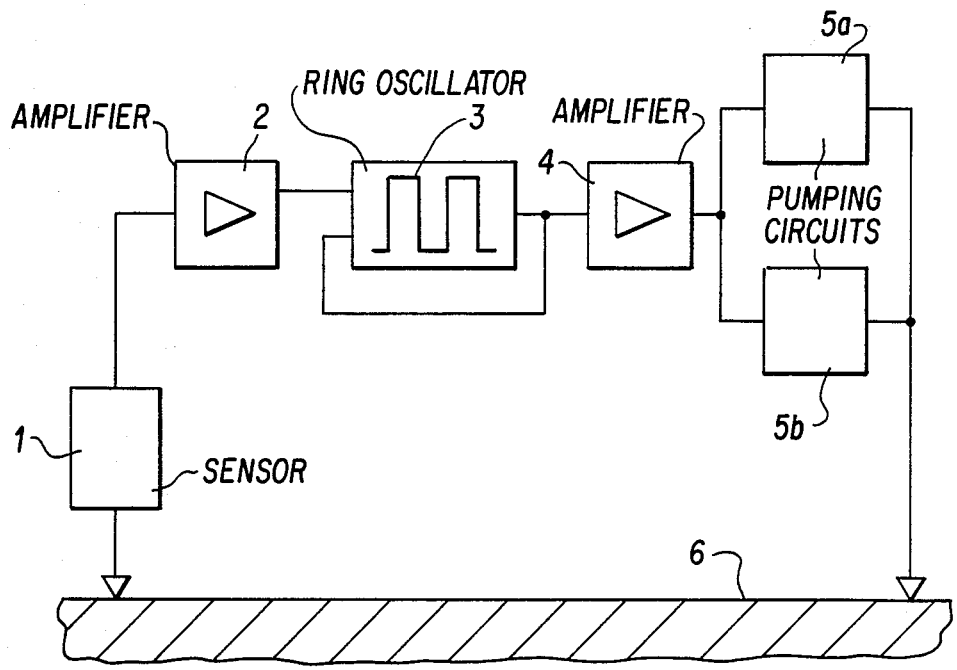

United States Patent [19]

Scade et al.

[11] Patent Number: 4,843,256
[45] Date of Patent: Jun. 27, 1989

[54] CONTROLLED CMOS SUBSTRATE VOLTAGE GENERATOR

[75] Inventors: Andreas Scade; Reinhard Hoenig; Horst-Guenther Schniek, all of Dresden, German Democratic Rep.

[73] Assignee: Jenoptik Jena GmbH, Jena, German Democratic Rep.

[21] Appl. No.: 120,560

[22] Filed: Nov. 13, 1987

[30] Foreign Application Priority Data

Dec. 23, 1986 [DD] German Democratic Rep. .................................. 2983011
Mar. 31, 1987 [DD] German Democratic Rep. .................................. 3012800
Mar. 31, 1987 [DD] German Democratic Rep. .................................. 3012817

[51] Int. Cl.$^4$ .................. H03K 3/01; H03K 3/335; H03K 17/56; H03L 29/78
[52] U.S. Cl. .................. 307/296.2; 307/296.5; 307/303.2; 307/304; 307/246; 357/23.6; 357/42; 357/52
[58] Field of Search .................. 307/296.2, 296.5, 246, 307/303.2, 304; 357/23.6, 42, 52

[56] References Cited

U.S. PATENT DOCUMENTS

| | | | |
|---|---|---|---|
| 3,794,862 | 2/1974 | Jenne | 307/304 |
| 4,336,466 | 6/1982 | Sud et al. | 307/304 |
| 4,591,738 | 5/1986 | Bialas, Jr. et al. | 307/304 |
| 4,636,658 | 1/1987 | Arakawa | 357/23.6 |
| 4,670,669 | 6/1987 | Cottrell et al. | 307/296.2 |
| 4,695,746 | 9/1987 | Tobita | 307/304 |

FOREIGN PATENT DOCUMENTS

| | | |
|---|---|---|
| 0024903 | 3/1981 | European Pat. Off. . |
| 0173980 | 3/1986 | European Pat. Off. . |
| 0175980 | 4/1986 | European Pat. Off. . |
| 3244327 | 6/1983 | Fed. Rep. of Germany . |
| 3530092 | 4/1986 | Fed. Rep. of Germany . |

Primary Examiner—John S. Heyman
Assistant Examiner—Trong Quang Phan
Attorney, Agent, or Firm—Jordan and Hamburg

[57] ABSTRACT

A controlled CMOS substrate voltage generator generates a rectangular wave pulse which is supplied to the pumping circuit by a pumping capacitor and controlled decoupling members. At the same time the decoupling members are activated by a control circuit and are completely opened, so that the full pumping lift is completely utilized without reduction due to threshold voltages. In order to reduce the injection of charge carriers of nCMOS decoupling members, inversely activated pMOS decoupling members, which are strongly conducting at low substrate bias voltage near 0V, are connected in parallel to the latter. To increase performance, the circuit is designed as a circuit in phase opposition. Improved sensors are provided, which during the active phase maintain the shift of the substrate voltage produced upon wobble of the bit strings toward more negative values by alternation of the reference voltage of the sensor.

6 Claims, 3 Drawing Sheets

CONTROLLED CMOS SUBSTRATE VOLTAGE GENERATOR

The invention is used for acting upon the substrate of a semiconductor chip having a negative substrate voltage during operation. Cases of application are in particular dynamic memories.

Known substrate voltage generators work according to the principle that a ring oscillator generates a periodic oscillation and this oscillation is connected by a pumping capacitor and decoupling diodes with ground and substrate in such fashion that the substrate is charged to a negative voltage. Such a circuit is described, for instance, in EP No. 24,903, wherein an additional voltage limiter of two n-channel FET diodes connected in series limits the voltage $U_B$ of the substrate to twice the threshold voltage $U_T$. In pumping circuits with decoupling diodes, reduction of the pumping lift to a voltage reduced by 2 $U_T$, which results in slower attainment of readiness for service than with full pumping lift, is disadvantageous. To obtain full pumping lift, EP No. 173,980 discloses that the reference potential for the pumping capacitor may be depressed by a bootstrap circuit.

However, the possibility that an injection of charge carriers into the substrate may take place by way of the n-channel FET diodes when the node at the pumping capacitor is charged to positive values near the threshold voltage of the parasitic pn junctions (n+ substrate), is similarly disadvantageous.

Likewise disadvantageous is the fact that in various operating states the substrate voltage is influenced capacitively.

A variety of solutions are known for keeping the substrate voltage constant.

For instance, it is possible to connect additional pumping circuits with application of the line or column selection signal $\overline{RAS}$ or $\overline{CAS}$. Such circuits are described in DE Nos. 3,244,327; 3,530,092 and EP No. 175,980. It is characteristic here that the substrate voltage—disregarding time constants—is held at an essentially constant value.

Here it is disadvantageous that on the $\overline{RAS}$ side, after a "low" due to wobble of the bit strings, the substrate voltage is shifted by a given value toward more negative values and the substrate voltage, due to leakage currents, therefore drifts to the value of the substrate voltage definitely predetermined by the sensor. Then the value of the drift is a function of the length of the $\overline{RAS}$ phase.

The object of the invention consists in providing a CMOS substrate voltage generator which charges the substrate voltage extremely rapidly to the final value and rapidly smooths out substrate voltage fluctuations and in which there is no risk of injection of charge carriers by n+ regions of nMOS transistors. In addition, suitable measures are to be provided to hold the substrate voltage at the value that the voltage has assumed after the $\overline{RAS}$ side due to wobble of the bit strings.

The invention accomplishes the object of providing a substrate voltage generator for obtaining extremely brief times for charging the substrate to the required value, wherein charge of the substrate is effected by controlled decoupling members—preferably controlled MOS transistors. To increase pumping performance at substrate voltages near zero V, charging is secured by other decoupling members, connected in parallel, which simultaneously prevent injection of charge carriers into the substrate. At the same time, the circuit is designed as a push-pull circuit.

In addition, the substrate voltage is kept at a low value during the $\overline{RAS}$ phase.

The controlled CMOS substrate voltage generator contains a comparator which, when the final value of the substrate voltage $U_B$ is reached in relation to the ground potential $U_{SS}$, influences the ring oscillator.

The ring oscillator is connected by an amplifier with a pumping circuit of a pumping capacitor and a first pMOS decoupling member between ground and pumping capacitor and a second nMOS decoupling member between pumping capacitor and the substrate.

At the same time, the comparator consists of a sensor with an amplifier. The sensor then consists of a series arrangement, a power source and a resistance combination between the supply voltage and the substrate. In addition, the resistance combination consists of MOS transistors.

The voltage across the resistance combination referred to ground then forms an essentially constant output voltage, which varies slightly only due to normal variations and which represents the input voltage for subsequently inserted parts of the controlled substrate voltage generator.

Pursuant to the invention, the output of the amplifier is connected by a first delay member with the first pumping circuit and by a second inverting delay member with a second pumping circuit working in phase opposition. There the two delay members have the same time lag ($\tau_1$), so that the two pumping circuits work in phase opposition. In addition, two control circuits are provided, each consisting of a delay member and a capacitor. At the same time, the first control circuit is connected with the gates of the two decoupling members of the first pumping circuit and the second control circuit is then connected with the gates of the two decoupling members of the second pumping circuit. The delay member of the first control circuit then inverts the signal of the amplifier upon like time lag ($\tau_2$) with respect to the second control circuit, but less time lag ($\tau_2 < \tau_1$) than the time lag ($\tau_1$) of the pumping circuits. In addition, the gates of the decoupling members of the pumping circuits are in each instance connected with ground by pMOS diodes biased in the direction of flow.

In refinement of the invention, to the nMOS decoupling members between the pumping capacitor and substrate there are connected in parallel pMOS decoupling members, whose gates are in each instance connected with the control circuit working in phase opposition. In addition, pMOS discharge transistors are arranged between the gates of the pMOS decoupling members and ground, which are controlled by the control circuits working in phase.

In a refinement of the invention, one of the two pMOS diodes drops out upon a designated transient response of the ring oscillator. In this connection, the transient response is to be determined by dimensioning measures so that the pMOS diode drops out on the control circuit on which a high/low side first appears.

In operation of the controlled substrate voltage generator, the comparator constantly measures the substrate voltage $U_B$. When the substrate voltage fails to be reached $-U_B < 2U_T$ (negative values) the comparator, in accordance with the adjustment of the load transistor, blocks the gate of the ring oscillator, which opens at positive substrate voltages $-U_B > 2U_T$. The oscillation obtained is decoupled by the amplifier. The pumping circuits receive a signal shifted exactly T/2 in phase, so that they work in phase opposition. The associated control circuit works in anticipation of and inversely to the pumping circuit.

At the low side a voltage jump of $-U_{OC}$ appears on the pumping capacitor. Since the pMOS decoupling member connected with ground was previously conducting and fully activated, the voltage on the pumping capacitor was near 0 V. Now the nMOS decoupling member as well as the pMOS decoupling member activated by the control circuit working in phase opposition become conducting. At substrate voltages near 0 V the pMOS decoupling member is fully conducting and prevents the injection of charge carriers from the nMOS decoupling member directly into the substrate. At substrate voltages near $-2U_T$ the nMOS decoupling member assumes preliminary charging of the substrate to a greater extent.

At the high side the voltage on the pumping capacitor is renewed near 0 V and the decoupling members alter their conductivity. The gate of the pMOS decoupling member is simultaneously discharged by the pMOS discharge transistor. The advantages of the controlled CMOS substrate voltage generator lie in that, firstly, the full voltage lift is available for preliminary charging of the substrate without reduction due to threshold voltages in diode decoupling elements, in that, secondly, a high performance prevails at every substrate voltage due to the parallel connection of pMOS and nMOS decoupling elements, and there is no risk of injection of charge carriers into the substrate due to the nMOS decoupling member.

Thirdly, it is advantageous that the entire circuit employs the principle of phase opposition, which results in a very efficient preliminary charge of the substrate.

In a refinement of the invention, in the sensor in the unselected state of the charge-storage circuit in the resistance combination of MOS transistors, an additional MOS transistor is connected in parallel to one of the MOS transistors.

In another refinement of the invention, at the same time the line selection signal $\overline{RAS}$ is connected by a threshold switch with the gate of the transistor connected in parallel. In the selected state ($\overline{RAS}$=low) the parallel-connected MOS transistor is thus not conducting and increases the resistance value of the resistance combination. At a constant applied current, a greater voltage therewith decreases across the latter. Owing to simultaneous wobble of the bit strings, the potential of the substrate is shifted downward. Dimensioning permits the voltage shifts to be equalized.

When the output voltage continues to be nearly constant, the sensor thus holds the substrate voltage at this low value.

In another refinement of the invention, in the sensor in the resistance combination of MOS transistors the gate of the first MOS transistor is connected to ground by an additional MOS transistor. At the same time the line selection signal $\overline{RAS}$ is connected by a threshold switch to the gate of the additional MOS transistor. Lastly, a capacitor is arranged between the gate of the first MOS transistor and the substrate.

Now if wobble of the bit strings is initiated by the $\overline{RAS}$ signal, the potential of the substrate drops. The gate of the first MOS transistor in the resistance combination is simultaneously cut off from ground and floated by the now blocking additional MOS transistor. The drop in substrate potential is now transferred to the gate and increases the resistance value, so that when current is constant a fairly great voltage decrease occurs by way of the resistance combination. Dimensioning makes it possible for the drop of substrate potential to equal the increase of the voltage decreasing by way of the resistance combination. With continued nearly constant output voltage, the sensor thus follows the reference voltage in accordance with the variation of substrate potential.

The invention will now be explained in detail with reference to an example and with the aid of three drawings, wherein FIG. 1 shows the substrate voltage generator as a block diagram FIG. 2, the pumping circuit with nMOS diodes for illustrating the mechanism of charge carrier injection FIG. 3, the controlled substrate voltage generator pursuant to the invention with a known sensor FIG. 4, the sensor in a first improved form FIG. 5, the sensor in a second improved form.

In FIG. 1 the substrate voltage generator is represented as a block diagram. It contains a sensor (1), after which is inserted an amplifier (2). The sensor (1) and the amplifier (2) thereby form a comparator. At the same time, the output of the amplifier (2) assumes only two states. A controlled ring oscillator (3) is inserted after the amplifier (2). The ring oscillator (3) is connected by an additional amplifier (4) with two pumping circuits (5a; 5b) working in phase opposition. For its part, the substrate (6), influenced by the pumping circuits (5a; 5b), closes the control loop to the sensor (1).

Figure 2:
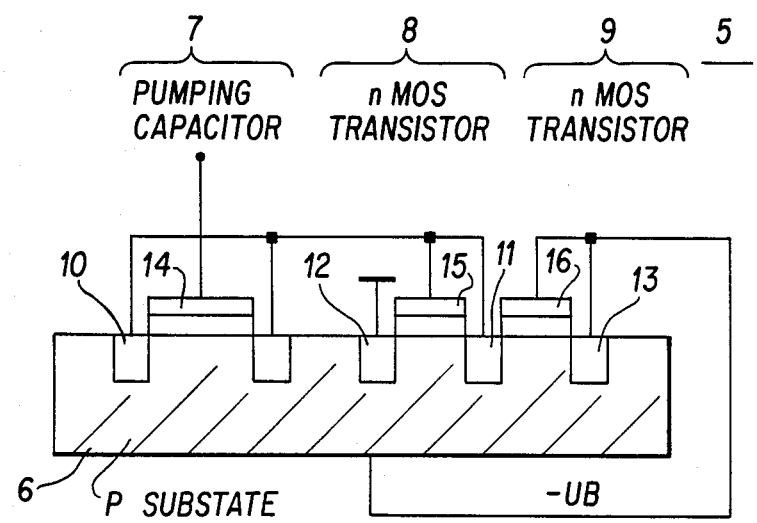

The pumping circuit (5) of a substrate voltage generator, represented in FIG. 2, contains the p-type substrate (6), on which in nMOS technology are located a pumping capacitor (7) and two nMOS transistors (8) and (9).

To the pumping capacitor (7) is assigned an active region (10), to the transistor (8) the active regions (11) and (12), and to the transistor (9) the active regions (11) and (13).

At the same time, periodic oscillation is applied to the gate (14) of the pumping capacitor (7). The active region (10) is connected with the active region (11) and the gate (15) of the transistor (8). The active region (12) is connected with the ground potential $U_{SS}$ and the active region (13) is connected with the gate (16) of the transistor (9) and the substrate (6). When the node between the active region (10) and the active region (11) during the connecting phase becomes more negative by the threshold voltage $U_T$ of the parasitic p-n junction between the active regions (10; 11) and the substrate (6), the p-n junctions become conducting and charge carriers flow into the substrate (6).

Figure 3:
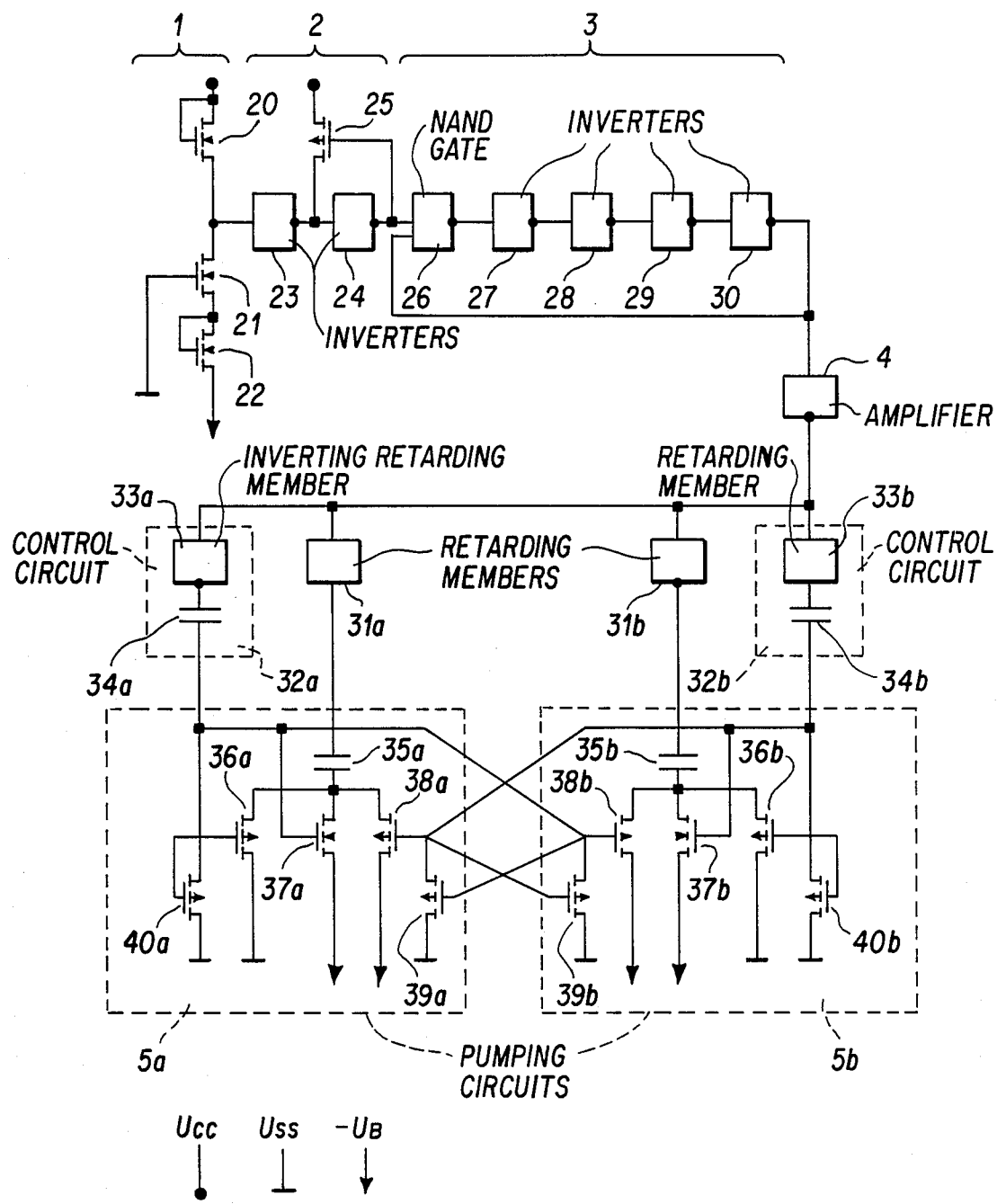

The CMOS substrate voltage generator pursuant to the invention is represented in FIG. 3. It contains the sensor (1) for comparison of the substrate voltage $-U_B$ and the ground potential $U_{SS}$. Between the supply voltage $U_{CC}$ and the substrate (6) the sensor (1) contains a series arrangement of a load transistor (20), a ground-controlled nMOS transistor (21) and an nMOS transistor (22) connected as diode.

The amplifier (2), which consists of two inverters (23; 24) connected in series, is inserted after the output of the sensor (1).

The output of the inverter (24) [sic] controls a pMOS transistor (25), which is arranged between the supply voltage $U_{CC}$ and the input of the inverter (24). When there is a small negative substrate voltage $-U_B$ the nMOS transistors (21; 22) are suppressed and the inverter (23) is thereupon activated and the inverter (24) suppressed. The output of the inverter (24) then carries high potential. At a substrate voltage $-U_B > 2U_T$ the nMOS transistors (21; 22) open, owing to which the inverter (24) finally carries low potential at the output.

The amplifier (2) is connected with the ring oscillator (3), which contains a NAND (26) with two inputs and four inverters (27; 28; 29; 30) inserted in series. The output of the ring oscillator (3) firstly is coupled back to the second input of the NAND (26) and secondly, connected with the amplifier (4). With low potential at the input, the NAND (26) blocks and the ring oscillator (3) does not oscillate, with high potential, on the other hand, the ring oscillator (3) begins to oscillate. Thus a periodic oscillation between the supply voltage $U_{CC}$ and ground $U_{SS}$ is applied at the output of the amplifier (4). The output of the amplifier (4) is connected by a first retarding member (31a) with the first pumping circuit (5a) and by a second inverting retarding member (31b) with the second pumping circuit (5b), which works in phase opposition to the pumping circuit (5a).

The two retarding members (31a; 31b) therefore exhibit the same time lag $\tau_1$.

In addition, the amplifier (4) is connected with a first control circuit (32a), which contains a third inverting retarding member (33a) and a capacitor (34a), as well as with a second control circuit (32b), which contains a fourth retarding member (33b) and a capacitor (34b). At the same time, the retarding members (33a; 33b) have an equally great time lag $\tau_2$, which is smaller than the time lag $\tau_1$. In addition, each pumping circuit (5a; 5b) contains a pumping capacitor (35a; 35b) as well as a pMOS decoupling member (36a; 36b) between ground $U_{SS}$ and the pumping capacitor (35a; 35b), an nMOS decoupling member (37a; 37b) between the pumping capacitor (35a; 35b) and the substrate (6) as well as a pMOS decoupling member (38a; 38b) likewise between the pumping capacitor (35a; 35b) and the substrate (6). The gates of the decoupling members (36a; 37a) are connected with the control circuit (32a) and the gates of the decoupling members (36b; 37b) are connected with the control circuit (32b). The gates of the pMOS decoupling members (38a; 38b) are in each instance connected with the control circuit (32b; 32a) working in phase opposition. A pMOS discharge transistor (39a; 39b), which is controlled by the control circuit (32a; 32b); is arranged between the gate of the pMOS decoupling member (38a; 38b) and ground $U_{SS}$. In addition, a pMOS diode (40a; 40b) is in each instance arranged in the direction of flow between ground $U_{SS}$ and the gates of the decoupling members (36a; 37a) and the decoupling members (36b; 37b).

Figure 4:
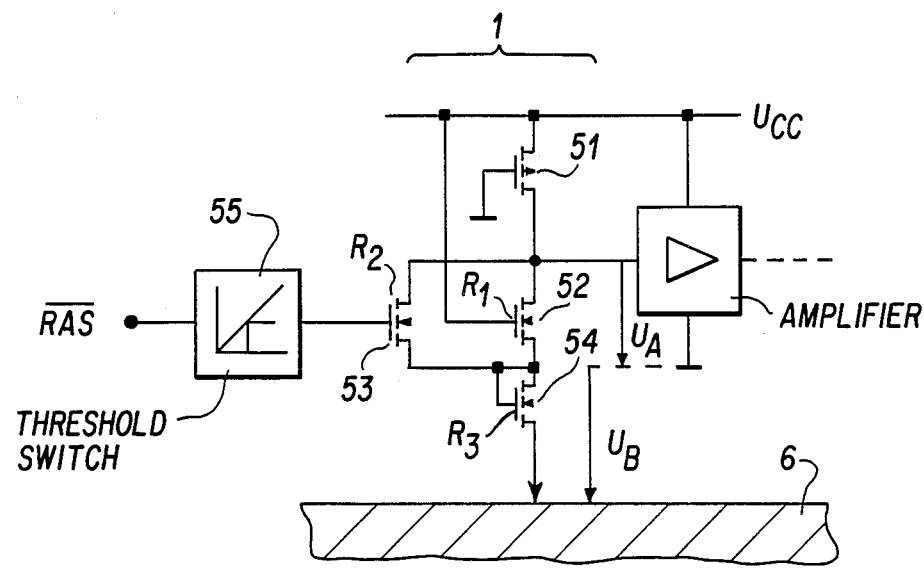

An improved form of the sensor (1) is represented in FIG. 4. Between the supply voltage $U_{CC}$ and the substrate (6), the sensor (1) contains a series arrangement of a pMOS transistor (51), a parallel circuit of an nMOS transistor (52) connected as diode with an MOS transistor (53), and an nMOS transistor (54) likewise connected as diode. The pMOS transistor (51) then works as a constant source of current. The voltage across the nMOS transistors (52; 54) biased in the conducting direction is the reference voltage referred to substrate (6) and the voltage across the nMOS diodes (52; 54) referred to ground $U_{SS}$ forms the output voltage $U_A$, which is essentially constant all the way to normal variations. In addition, the line selection signal $\overline{RAS}$ is connected with a threshold switch (55).

During the inactive phase of the charge-circuit circuit the nMOS transistors (52; 54) ($R_1$; $R_3$) and the nMOS transistor (53) ($R_2$) form a resistance combination, across which the constant current I generates the following voltage drop $$U_B + U_A = I(R_1 \| R_2 + R_3)$$

with $U_B$ = substrate voltage
$U_A$ = output voltage
In the active phase the nMOS transistor (53) is blocked and $$U_B + U_A + \Delta U_B = I(R_1 + R_3)$$

follows, with $\Delta U_B$ = additional shift of the substrate voltage in negative direction. Suitable dimensioning permits the substrate voltage shift on wobble of the bit strings to be designed equal to the shift of the reference voltage of the sensor (1). During the active phase the substrate voltage $U_B + \Delta U_B$ thus does not drift and steady operating values prevail.

Figure 5:
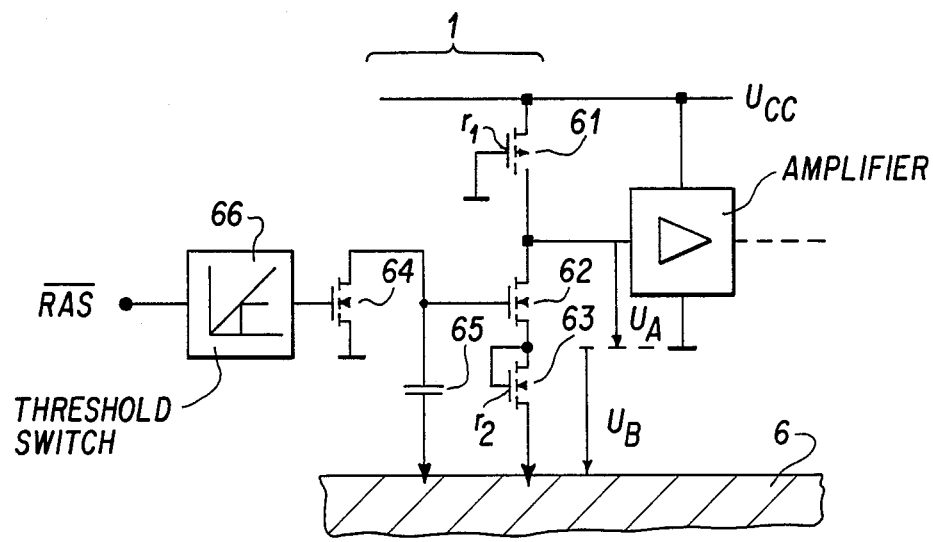

Another improved form of the sensor is represented in FIG. 5.

The sensor (I) contains, between the supply voltage $U_{CC}$ and the substrate (6), a series arrangement of a pMOS transistor (61), an nMOS transistor (62) and an nMOS transistor (63), which is connected in conducting direction as a diode.

The pMOS transistor (61) then works as a constant source of current. The voltage across the nMOS transistor (62) and the nMOS transistor (63) biased in conducting direction is the reference voltage referred to substrate (6), and the voltage across the nMOS transistor (62) and the nMOS transistor (63) referred to ground $U_{SS}$ is formed by the output voltage $U_A$, which is essentially constant all the way to normal variations.

An nMOS transistor (64) is arranged between the gate of the nMOS transistor (62) and ground $U_{SS}$ and a capacitor (65) is arranged between the gate of the nMOS transistor (62) and the substrate (6). The $\overline{RAS}$ signal is connected by a threshold switch (66) with the gate of the nMOS transistor (64).

In the inactive phase, the reference voltage of the sensor (1), at a constant current I through the pMOS transistor (61) and the resistances $r_1$ for the nMOS transistor (61) and $r_2$ for the nMOS transistor (63), results in $$U_B + U_A = I(r_1(U_G = 0 \text{ V}) + r_2)$$

In the active phase, the substrate potential is reduced by the value $\Delta U_B$.

Hence the following applies:

$$U_B + U_A + \Delta U_B = I(r_1(U_G = -\Delta U_B') + r_2)$$

with
$U_B$ = substrate voltage
$\Delta U_B$ = substrate voltage shift
$\Delta U_B'$ = capacitively divided shift
$U_A$ = output voltage Suitable dimensioning produces a variation of the resistance value of the nMOS transistor (61) corresponding to the forced shift of the substrate potential.

We claim:

I claim:

1. In a controlled CMOS substrate voltage generator having a comparator for comparing a substrate voltage and ground potential, a ring oscillator coupled to the output of the comparator, an amplifier coupled to the output of the oscillator, a pumping circuit coupled to the output of the amplifier, the comparator being comprised of a sensor with an amplifier, the sensor being comprised of a series arrangement of a power source and a resistance combination connected between the supply voltage and the substrate, the resistance combination being comprised of MOS transistors, the supply voltage comprising an essentially constant output voltage across the resistance combination with respect to ground, the improvement comprising first delay means and second inverting delay means, the pumping circuit comprising first and second pumping circuits each having a pumping capacitor and parallel connected nMOS and pMOS decoupling means connected between the respective pumping capacitor and signal ground, said decoupling means having gates, said first and second pumping circuits also having separate pMOS diodes, the output of the amplifier being connected to the first pumping circuit via the first delay means and to the second pumping circuit via the second inverting delay means whereby the first and second pumping circuits operate in phase opposition, the first and second delay means having the same time lag ($\tau_1$), a first control circuit comprised of a third inverting delay means and a first capacitor connected between the amplifier and the gates of the decoupling members of the first pumping circuit, and a second control circuit comprised of a fourth delay means and a second capacitor connected between the amplifier and the gates of the decoupling means of the second pumping circuit, the third and fourth delay means having the same time lag ($\tau_2$), which is smaller than the time lag ($\tau_1$), the gates of the decoupling means of the first and second pumping circuits being connected to the respective pMOS diodes, said diodes being biased in the direction of flow and having ground potential ($U_{SS}$).

2. Controlled CMOS substrate voltage generator according to claim 1, further comprising first and second pMOS decoupling means having gates and being connected in parallel with the nMOS decoupling means of the first and second pumping circuits respectively, the gates of the first and second pMOS decoupling means being connected to the second and first control circuits, respectively, and further comprising first and second pMOS discharge transistors arranged between the gates of the first and second pMOS decoupling members respectively and ground ($U_{SS}$) and having gates controlled by the first and second control circuits, respectively.

3. Controlled CMOS substrate voltage generator according to claim 1, wherein said ring oscillator has a constant transient response.

4. Controlled CMOS substrate voltage generator according to claim 1, wherein the sensor comprises a series circuit of first and second MOS transistors, and further comprising a third MOS transistor connected in parallel with the second MOS transistor, and further comprising an external terminal, said third MOS transistor having a gate connected to said external terminal.

5. Controlled CMOS substrate voltage generator according to claim 4, wherein the line selection signal (e,ovs/RAS/ ) is connected to the gate of said third MOS transistor by a threshold switch.

6. Controlled CMOS substrate voltage generator according to claim 4, wherein a source of a line selection signal (RAS) is connected by way of a threshold switch to said external terminal.

* * * * *